United States Patent
Krochmal et al.

(10) Patent No.: US 6,577,737 B1
(45) Date of Patent: Jun. 10, 2003

(54) METHOD OF DETECTING A DC OFFSET IN AN AUTOMOTIVE AUDIO SYSTEM

(75) Inventors: Andrew C. Krochmal, Plymouth, MI (US); Gregory R. Hamel, Livonia, MI (US); John E. Whitecar, Plymouth, MI (US)

(73) Assignee: Visteon Global Technologies, Inc., Dearborn, MI (US)

( * ) Notice: Subject to any disclaimer, the term of this patent is extended or adjusted under 35 U.S.C. 154(b) by 0 days.

(21) Appl. No.: 09/506,295

(22) Filed: Feb. 17, 2000

(51) Int. Cl.[7] .............................................. H03G 11/00
(52) U.S. Cl. ........................ 381/55; 381/120; 381/94.5
(58) Field of Search ........................... 381/55, 94.5, 96, 381/120; 330/207 P

(56) References Cited

U.S. PATENT DOCUMENTS 4,330,686 A * 5/1982 Roe ........................ 330/207 P
5,255,324 A * 10/1993 Brewer et al. .............. 381/102
5,633,940 A * 5/1997 Wassink ..................... 381/102
5,815,584 A 9/1998 Whitecar et al.

* cited by examiner

*Primary Examiner*—Forester W. Isen
*Assistant Examiner*—Brian Pendleton
(74) *Attorney, Agent, or Firm*—MacMillan, Sobanski & Todd, LLC

(57) ABSTRACT

A method of detecting a DC offset in an audio signal provided by an audio processing unit to an audio power amplifier, wherein the audio amplifier provides a clip detect signal back to the audio processing unit, wherein the method comprises the steps of sampling the clip detect signal to determine if the clip detect is active. Detecting a power level of the audio amplifier if the clip detect is active. Next, comparing the power level to a predetermined power threshold. Then, identifying a dc offset if the power level is less than the predetermined power threshold.

14 Claims, 3 Drawing Sheets

METHOD OF DETECTING A DC OFFSET IN AN AUTOMOTIVE AUDIO SYSTEM

BACKGROUND

The present invention relates in general to detecting a DC offset in an automotive audio system, and, more specifically, to use of a diagnostic signal from a power amplifier to determine output conditions of the power amplifier as they are affected by a DC offset.

Automotive audio systems typically have a power amplifier intended to amplify AC signals, but which will amplify any signal which is presented at the amplifier's input. Audio speakers, (normally 4 ohms), which are attached to the amplifier can be damaged by certain amounts of DC current. Capacitors are normally used on an input side of the amplifier to remove any DC offset in the amplifier input signal, thereby preventing DC current from flowing to the speakers. In the event these capacitors fail or are inadvertently not present, there can be substantial damage caused to the amplifier and/or the speakers. Currently, most automotive audio systems have protection for shorts but not for DC offsets. Copending application serial No. 199-1348 provides a way for sensing relatively large DC offsets. In some situations, however, it may also be desirable to provide DC offset detection when there is only a small audio signal present or the audio signal is not clipping at a high rate.

SUMMARY OF THE INVENTION

The present invention provides automatic detection of a DC offset when AC signals are small or the audio signal is not clipping at a high rate. In one aspect, the method detects a DC offset in an audio signal provided by an audio processing unit to an audio power amplifier, wherein the audio amplifier provides a clip detect signal back to the audio processing unit. The method begins by sampling the clip detect signal to determine if the clip detect is active. A power level of the audio amplifier is detected if the clip detect is active. Next, the power level is compared to a predetermined power threshold. A DC offset is identified if the power level is less than the predetermined power threshold.

If clipping occurs when the audio power is low then the voltage must have been shifted by a DC offset. The present invention utilizes a power detection circuit and a clip detect to monitor the power level and the clipping rate of the audio signal to determine if a DC offset is present.

DETAILED DESCRIPTION OF PREFERRED EMBODIMENTS

Figure 1:
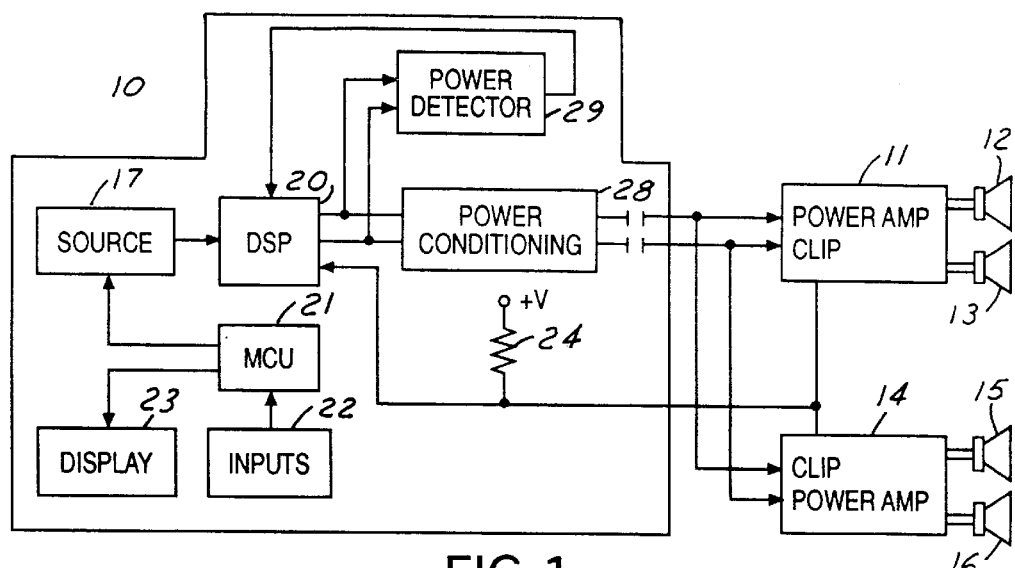
FIG. 1 is a block diagram showing the audio system of the present invention.

FIG. 1 shows an automotive audio system including an audio processing unit or head unit 10 and power amplifiers 11 and 14 driving speakers 12, 13, 15 and 16. Power amps 11 and 14 each drive left and right stereo speakers for front and rear speakers sets, respectively.

Figure 3:
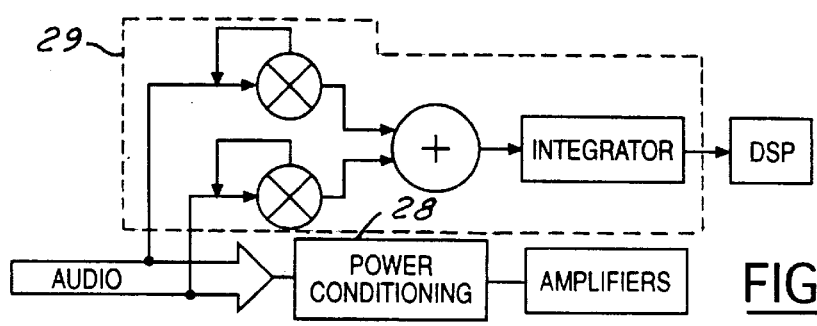
FIG. 3. Is a block diagram showing the power detection circuit.

Processing unit 10 includes an audio source 17 such as a radio tuner, cassette player, or compact disc player. An audio signal from source 17 is provided to an input of a digital signal processor (DSP) 20 which outputs left and right stereo signals. A power detection circuit 29 is located either between DSP 20 and a power conditioning circuit 28 or within DSP 20. As seen in FIG. 3, power detection circuit 29 comprises circuitry to measure power sent to all channels of the power amplifiers. Power detection is well known in the art. An integrator in series with a squaring and summing of the speaker signals will suffice. Capacitors 26 and 27 are located between power conditioning circuit 28 and power amplifier 14 and 11. Power conditioning circuit 28 includes digital-to-analog converter circuits for converting the DSP output to analog signals. The capacitors allow AC current signals to flow while preventing any DC current flow, thus preventing DC offset in the amplified signals. In the event these capacitors are shorted, missing or damaged, the speakers may be subjected to DC current which could potentially cause speaker damage.

A microcontroller unit (MCU) 21 communicates with DSP 20 and source 17 to control operation of the audio system. MCU 21 receives input commands from inputs 22 which may include push button operator controls or an interface to a multiplex network whereby commands may be received from other locations. A display 23 is connected to MCU 21 for displaying status of the audio processing unit to allow adjustment of audio parameters such as volume, balance and fade.

Power amps 11 and 14 provide outputs for respective clip detectors. The clip detector outputs indicate moments when clipping occurs in the output signal of the respective power amplifier. The clip detect outputs of power amps 11 and 14 are connected together and to a pull-up resistor 24 and an input of DSP 20 in audio processing unit 10. The clip detect outputs of power amp 11 and 14 are configured to provide a current sink(i.e. a direct connection to ground) when clipping occurs. Thus, the occurrence of clipping pulls the voltage at resistor 24 to ground, whereas the junction is at a high voltage from voltage supply +V when clipping is not occurring.

Figure 2:
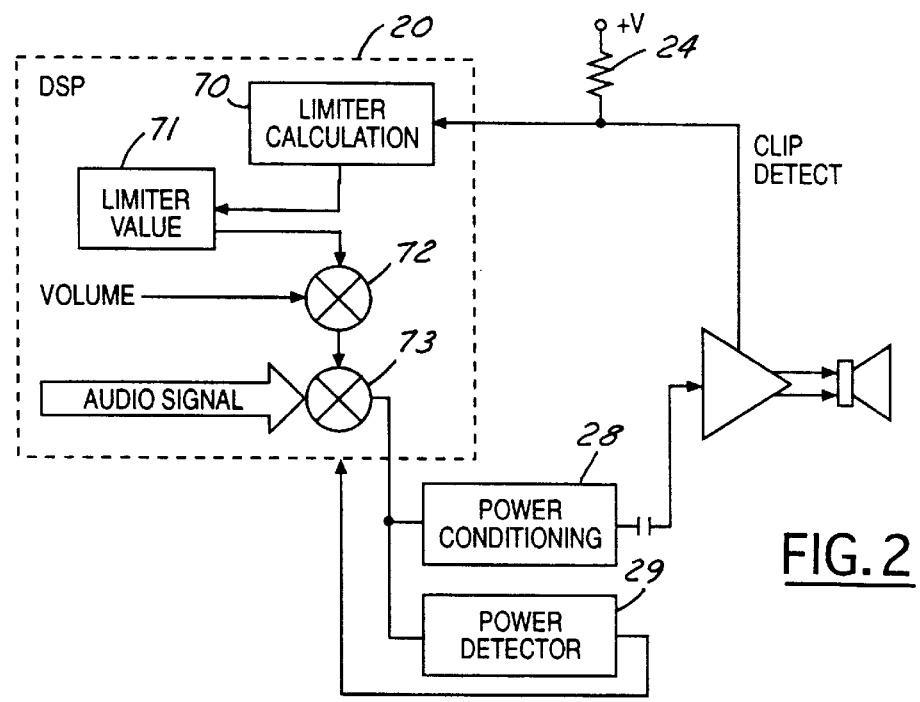
FIG. 2 is a block diagram showing portions of the audio system in an alternate embodiment.

FIG. 2 shows a DSP limiter function in which signal level is reduced in response to clipping. A clip detect signal provided from power amp 11 in conjunction with a pull-up resistor 24 is input to DSP 20 and is used in a limiter calculation which relates the severity of clipping with a particular limiter value. Specifically, the limiter value is reduced from a maximum value of 1.0 to a possible minimum value of 0.1 at a predetermined attack rate during clipping and is restored toward 1.0 at a slower decay rate when clipping is not present. Thus, a limiter calculation 70 produces a limiter value 71 which is stored in DSP 20 and is provided as a multiplier input to a multiplier 72 to reduce the volume command.

The output of multiplier 72 is provided to a multiplier 73 which multiplies the audio signal which is then provided to power amplifier 11 through power conditioning circuit 28.

The present invention analyzes clipping and power output to determine if a DC offset is present. The clip detect outputs are monitored for active states during normal operation. Software routines, for example, in DSP 20 utilize a timer and a counter to sample and count a number of active clip detects. A hardware/analog circuit counter and timer can also be used to monitor the clip detect outputs. A predetermined rate is used to determine when to sample the clip detect output. The predetermined rate can be a cycle time of DSP 20 such as every 26 microseconds, for example. If the clip detect output is active when a sample is taken then the counter is incremented. Accumulation of a predetermined number of samples, such as 1000, is used to determine when to compare the counter to a predetermined timer threshold. A predetermined time interval is determined by a minimum desired frequency that can produce clipping. If the predetermined rate is 26 microseconds then a predetermined time interval will be 1000×26×10−3 or 26 milliseconds. This equals about 38 Hz and is the lowest frequency that will be detected if and when it causes clipping.

The predetermined timer threshold can vary depending on the characteristics of the amplifier and the clip detect. Values from about 30 percent to about 50 percent of the total number of samples has been found to uniquely identify presence of a DC offset, for example. These values are typical because of a normal signal without DC offset can clip based on the nature of audio signals and a maximum output of the audio amplifier. A normal clipping rate for a DSP limiter function circuit is about 10 to 15 percent. Any clipping rate above the normal clipping rate is considered unusual and indicates a DC offset.

Power detection circuit 29 determines total power levels summed for all the input channels to the audio amplifiers. The power level is read and compared to a power threshold. The power threshold is chosen based on a lowest power level that will not cause clipping under normal operation. If the power level is below the threshold, but there is still clipping, then a DC offset is present. Typically, 1 watt referenced at the amplifier output is used as the power threshold. 1 Watt corresponds to a minimum power level that an average audio amplifier system may see. If there are legitimate audio signals which produce more then 1 watt, then the power threshold can be adjusted to ensure high level signals are not inadvertently seen as DC offsets.

Figure 4:
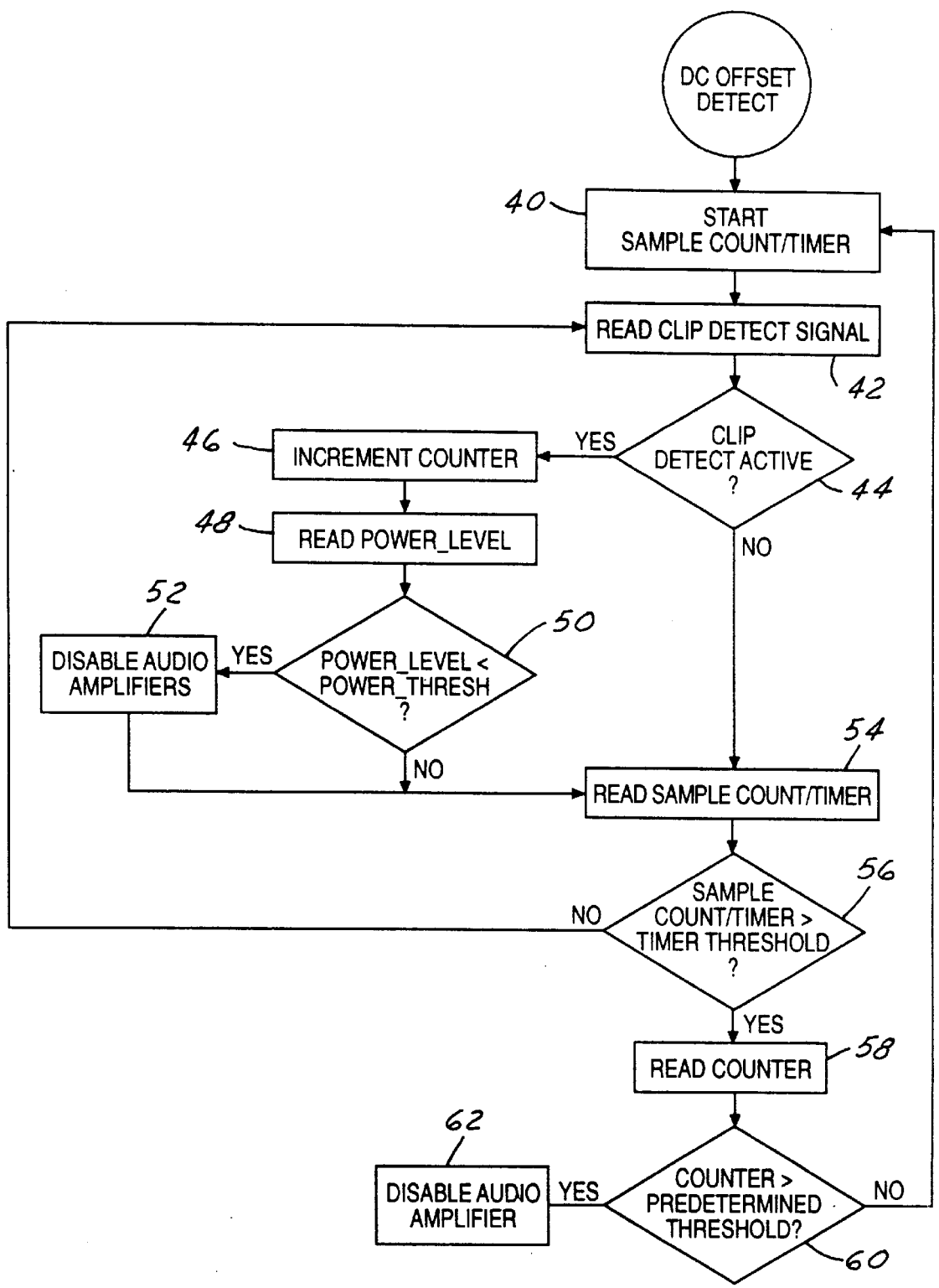
FIG. 4 is a flowchart showing the operation of the present invention.

FIG. 4 shows a method of detecting a DC offset in an audio amplifier. A sample count/timer is started in step 40. In step 42 a clip detect signal is sampled for active clips. Next, if the clip detect is active in step 44, a counter is incremented in step 46. A power level of the audio amplifier is read in step 48. If the power level is less then a power threshold in step 50 then the power amplifier is shut down in step 52. If the clip detect is not active in step 44 or the power level is not less then the power threshold in step 50 then the sample count/timer is read in step 54. If the sample count/timer has not exceeded a timer threshold in step 56 then steps 42–54 are repeated until the timer exceeds the timer threshold. After the sample count/timer exceeds the timer threshold, the counter is read in step 58. In step 60, the counter reading is compared to a predetermined threshold and if the counter reading exceeds the predetermined threshold then the audio amplifier is disabled in step 62, otherwise the process starts over at step 40.

Figure 5:
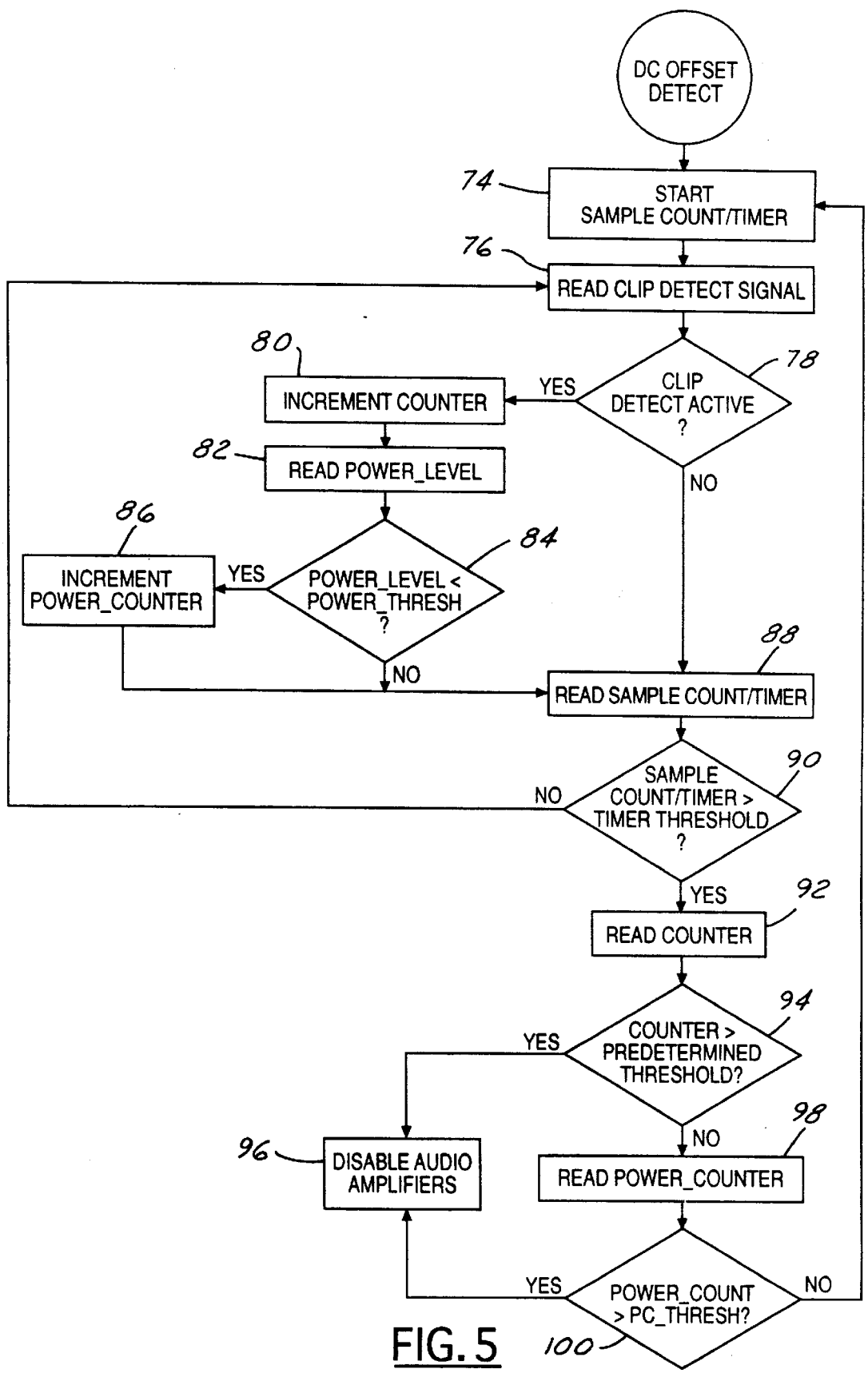
FIG. 5 is a flowchart showing the operation of an alternative embodiment of the present invention.

FIG. 5 shows an alternative method of detecting a DC offset in an audio amplifier. A sample count/timer is started in step 74. In step 76 a clip detect signal is sampled for active clips. Next, if the clip detect is active in step 78, a counter is incremented in step 80. A power level of the audio amplifier is read in step 82. If the power level is less then a power threshold in step 84 then a power counter is incremented in step 86. If the clip detect is not active in step 78 or after the power counter is incremented in step 86 the sample count/timer is read in step 88. If the sample count/timer has not exceeded a timer threshold in step 90 then steps 74–88 are repeated until the timer exceeds the timer threshold. After the sample count/timer exceeds the timer threshold, the counter is read in step 92. In step 94, the counter reading is compared to a predetermined threshold and if the counter reading exceeds the predetermined threshold then the audio amplifier is disabled in step 96, otherwise the power counter is read in step 98 and if the power counter is greater then a power counter threshold in step 100 the audio amplifier is shut down in step 96. The power counter threshold is derived from a smallest signal which would cause clipping in a normal operating audio amplifier. The counter threshold allows a signal which is momentarily below the power threshold to flow to the speakers. After the power counter reaches a value greater then the power counter threshold a DC offset is assumed to be present.

What is claimed:

1. A method of detecting a DC offset in an audio signal provided by an audio processing unit to an audio power amplifier, wherein said audio amplifier provides a clip detect signal back to said audio processing unit, wherein said method comprises the steps of:

sampling said clip detect signal to determine if said clip detect is active;

detecting a power level of said audio amplifier if said clip detect is active;

comparing said power level to a predetermined power threshold; and identifying a dc offset if said power level is less than said predetermined power threshold.

2. The method according to claim 1 wherein said audio processing unit includes a microprocessor and, wherein if said power level is less than said predetermined power threshold then a fault signal is sent to said microprocessor.

3. The method according to claim 1 wherein said predetermined power threshold is about 1 watt.

4. The method according to claim 1 wherein said predetermined power threshold is at least a maximum power level of a signal without a DC offset that provides no clipping.

5. The method according to claim 1 wherein if said power level is less than said predetermined power threshold then said audio power amplifier is shut down.

6. A system for detecting a DC offset in an audio amplifier with a clip detect signal comprising:

a timer/counter to sample said clip detect within a predetermined time interval until a sample threshold is reached;

a power level detection circuit for monitoring a power level of said audio amplifier when said clip detect is active;

wherein if said clip detect is active said power level is compared with a predetermined power threshold; and wherein if said power level is less than said predetermined power threshold then said DC offset is identified.

7. The system according to claim 6 wherein said power threshold is about 1 watt.

8. The system according to claim 6 wherein said power threshold is at least a maximum power level of a signal without a DC offset that provides no clipping.

9. The system according to claim 6 wherein if said power level is less than said predetermined power threshold then said audio amplifier is shut down.

10. A method of detecting a DC offset in an audio signal provided by an audio processing unit to an audio power amplifier, wherein said audio amplifier provides a clip detect signal back to said audio processing unit, wherein said method comprises the steps of:

sampling said clip detect signal to determine if said clip detect is active and incrementing a counter if said clip detect is active;

detecting a power level of said audio amplifier if said clip detect is active;

comparing said power level to a power threshold;

incrementing a power counter if said power level is less then said power threshold;

identifying a DC offset if said counter is greater then a predetermined threshold; and identifying a DC offset if said power counter is greater then a power counter threshold.

11. The method according to claim 10 wherein said power amplifier drives speakers.

12. The method according to claim 11 wherein said power counter threshold is derived from a smallest signal which would cause clipping, but would still have a minimum power level capable of driving said speakers.

13. The method according to claim 10 wherein said power threshold is at least a maximum power level of a signal without a DC offset that provides no clipping.

14. The method according to claim 10 wherein if said power counter is greater then said power counter threshold then said power amplifier is shut down.

* * * * *